United States Patent
Chen et al.

(10) Patent No.: US 12,315,750 B2
(45) Date of Patent: May 27, 2025

(54) GAS CURTAIN DEVICE FOR FRONT OPENING UNIFIED POD

(71) Applicants: AVEX-SG TECHNOLOGY INC., Taichung (TW); Yu-Hua Chen, Florham Park, NJ (US)

(72) Inventors: Jin-Bor Chen, Taichung (TW); Tsan-Hua Huang, Taichung (TW); Shun-Yi Hsu, Taichung (TW); Tzu-Hung Hsu, Taichung (TW)

(73) Assignees: Avex-SG Technology Inc., Taichung (TW); Yu-Hua Chen, Florham Park, NJ (US)

( * ) Notice: Subject to any disclaimer, the term of this patent is extended or adjusted under 35 U.S.C. 154(b) by 0 days.

(21) Appl. No.: 18/546,805

(22) PCT Filed: Nov. 8, 2022

(86) PCT No.: PCT/US2022/079433
§ 371 (c)(1),
(2) Date: Aug. 17, 2023

(87) PCT Pub. No.: WO2024/102155
PCT Pub. Date: May 16, 2024

(65) Prior Publication Data
US 2025/0006530 A1    Jan. 2, 2025

(51) Int. Cl.
*H01L 21/673* (2006.01)

(52) U.S. Cl.
CPC .. *H01L 21/67386* (2013.01); *H01L 21/67393* (2013.01)

(58) Field of Classification Search
CPC ......... H01L 21/02041; H01L 21/67393; H01L 21/67017; H01L 21/67386
USPC ................................ 206/832, 711, 710, 701
See application file for complete search history.

(56) References Cited

U.S. PATENT DOCUMENTS

| | | | |
|---|---|---|---|
| 7,802,986 B2 * | 9/2010 | Ooshima | H01L 21/6719 219/390 |
| 10,998,212 B2 * | 5/2021 | Lin | H01L 21/67769 |
| 2016/0376706 A1 * | 12/2016 | Miller | H01L 21/67017 239/565 |
| 2020/0020549 A1 * | 1/2020 | Ogawa | F16K 15/026 |
| 2020/0234988 A1 * | 7/2020 | Lin | H01L 21/67769 |
| 2023/0054047 A1 * | 2/2023 | Ku | H01L 21/67017 |
| 2023/0167992 A1 * | 6/2023 | Lin | H01L 21/67017 414/217 |
| 2023/0326775 A1 * | 10/2023 | Lin | H01L 21/67389 206/710 |

(Continued)

*Primary Examiner* — Chun Hoi Cheung
(74) *Attorney, Agent, or Firm* — Rosenberg, Klein & Lee

(57) ABSTRACT

A gas curtain device for a front opening unified pod has a casing. At least one first gas guide plate is disposed in the casing. The first gas guide plate has a first gas guide region. The first gas guide region has a plurality of first gas guide holes. A second gas guide plate is disposed at a distal end of the casing. The second gas guide plate has a second gas guide region. The second gas guide region has a plurality of second gas guide holes. The area of the first gas guide region is less than the area of the second gas guide region. The number of the second gas guide holes is greater than the number of the first gas guide holes. The total area of the second gas guide holes is greater than the total area of the first gas guide holes.

10 Claims, 11 Drawing Sheets

(56) References Cited

U.S. PATENT DOCUMENTS

2023/0369082 A1* 11/2023 Wu .................. H01L 21/67017

* cited by examiner

GAS CURTAIN DEVICE FOR FRONT OPENING UNIFIED POD

FIELD OF THE INVENTION

The present invention relates to a front opening unified pod, and more particularly to a gas curtain device for a front opening unified pod.

BACKGROUND OF THE INVENTION

In the semiconductor manufacturing industry, a front opening unified pod (FOUP) is a container used to protect, transport, and store wafers between processing steps. One of the most important functions is to prevent the internal wafers from being contaminated and affected by fine particles and moisture in the external environment during the transfer between different production machines. When a FOUP is transferred to the Load Port that attached on the EFEM for processing, the door on the front side of the front opening unified pod is opened, a clean and dry gas flow will be ejected downward through a gas curtain device disposed on the upper side of the load port door inside the equipment front end module (EFEM), thereby forming an invisible gas wall adjacent to the opening of the front opening unified pod, so as to prevent external fine particles and moisture from entering the front opening unified pod during wafer transfer process.

Wafers have very high requirements for fine particles-free and low moisture level in the environment. If the gas curtain device does not eject laminar flow with straight flow lines downward, but turbulent flow in a chaotic direction, it is very likely that the fine particles and the gas containing high moisture outside the front opening unified pod will be drawn into the front opening unified pod to cause contamination. As a result, the purpose of blocking fine particles and moisture from entering the front opening unified pod fails.

The top of a conventional gas curtain device has gas inlets that communicates with the inside of the gas curtain device. The inside of the gas curtain device has a transverse and slender space. The gas is introduced into the space of the gas curtain device via the gas inlets to form a gas flow. The space is provided with a plurality of gas vents which are spaced apart and arranged vertically. The gas flow is ejected out vertically and downwardly via the gas vents to form a gas curtain. However, the gas flow is quickly ejected via the gas vents then entering the space, there is no structural configuration for guiding the ejected gas flow to become laminar flow with straight flow lines. As a result, the gas flow is radially ejected from the gas vents, causing the gas flow to interfere with each other and the flow direction became chaotic.

After the gas flow is ejected from the gas vents to form the turbulent flow in a chaotic flow direction, which leads to the shortcoming that the fine particles and the gas containing high moisture in the EFEM will be drawn into the front opening unified pod.

SUMMARY OF THE INVENTION

The primary object of the present invention is to provide a gas curtain device for a front opening unified pod for a clean and dry gas to be blown out close to a laminar flow manner, so as to minimize the formation of turbulent flow and prevent the moisture and fine particles in the equipment front end module from entering the front opening unified pod during wafer transfer process.

In order to achieve the foregoing object, the present invention provides a gas curtain device for a front opening unified pod. The gas curtain device comprises a casing, at least one first gas guide plate, and a second gas guide plate.

The casing has an interior space. The casing has at least one gas inlet communicating with the interior space and a gas outlet communicating with the gas inlet and the interior space.

The first gas guide plate is disposed in the interior space. The first gas guide plate has a first gas guide region. The first gas guide region has a plurality of first gas guide holes.

The second gas guide plate is disposed at a distal end of the interior space adjacent to the gas outlet. The second gas guide plate has a second gas guide region facing the first gas guide region in a vertical direction. The second gas guide region has a plurality of second gas guide holes.

The area of the first gas guide region is less than the area of the second gas guide region. The number of the second gas guide holes is greater than the number of the first gas guide holes. The total area of the second gas guide holes of the second gas guide plate is greater than the total area of the first gas guide holes of the first gas guide plate.

DETAILED DESCRIPTION OF THE PREFERRED EMBODIMENTS

Figure 1:
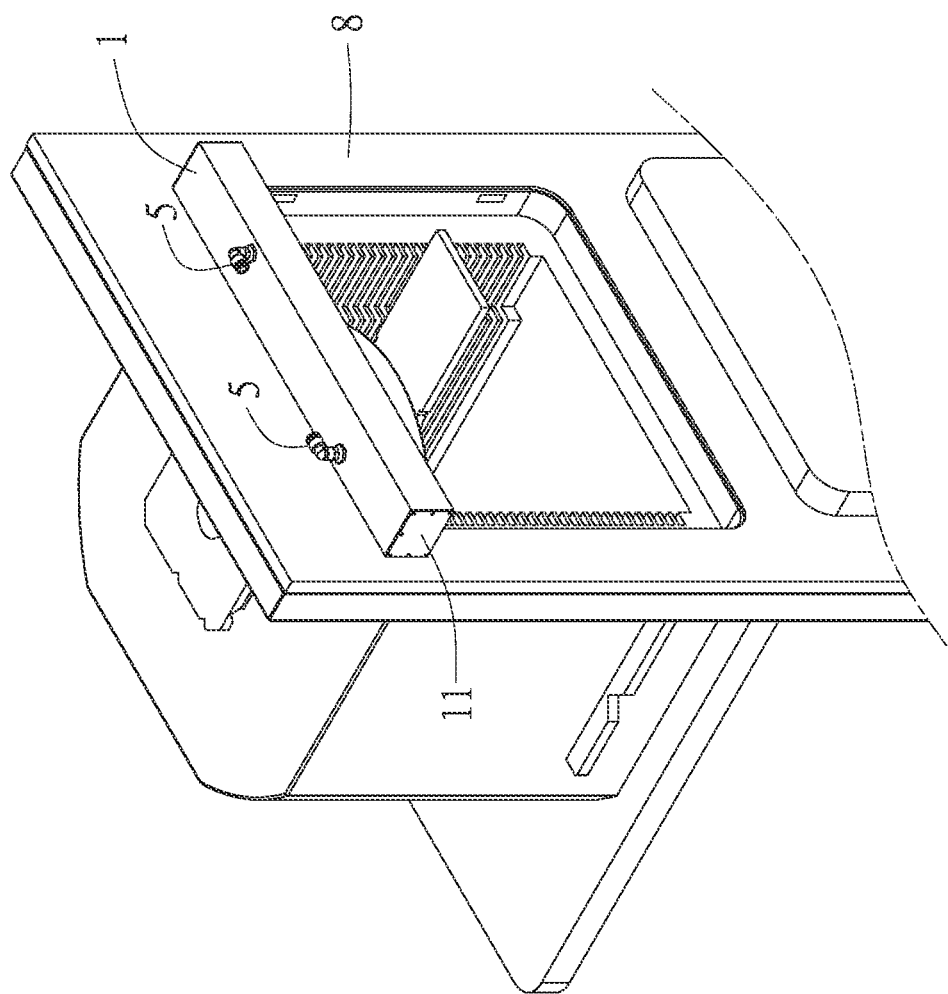
FIG. 1 is a perspective schematic view according to a first embodiment of the present invention mounted on a load port of a front opening unified pod.
Figure 2:
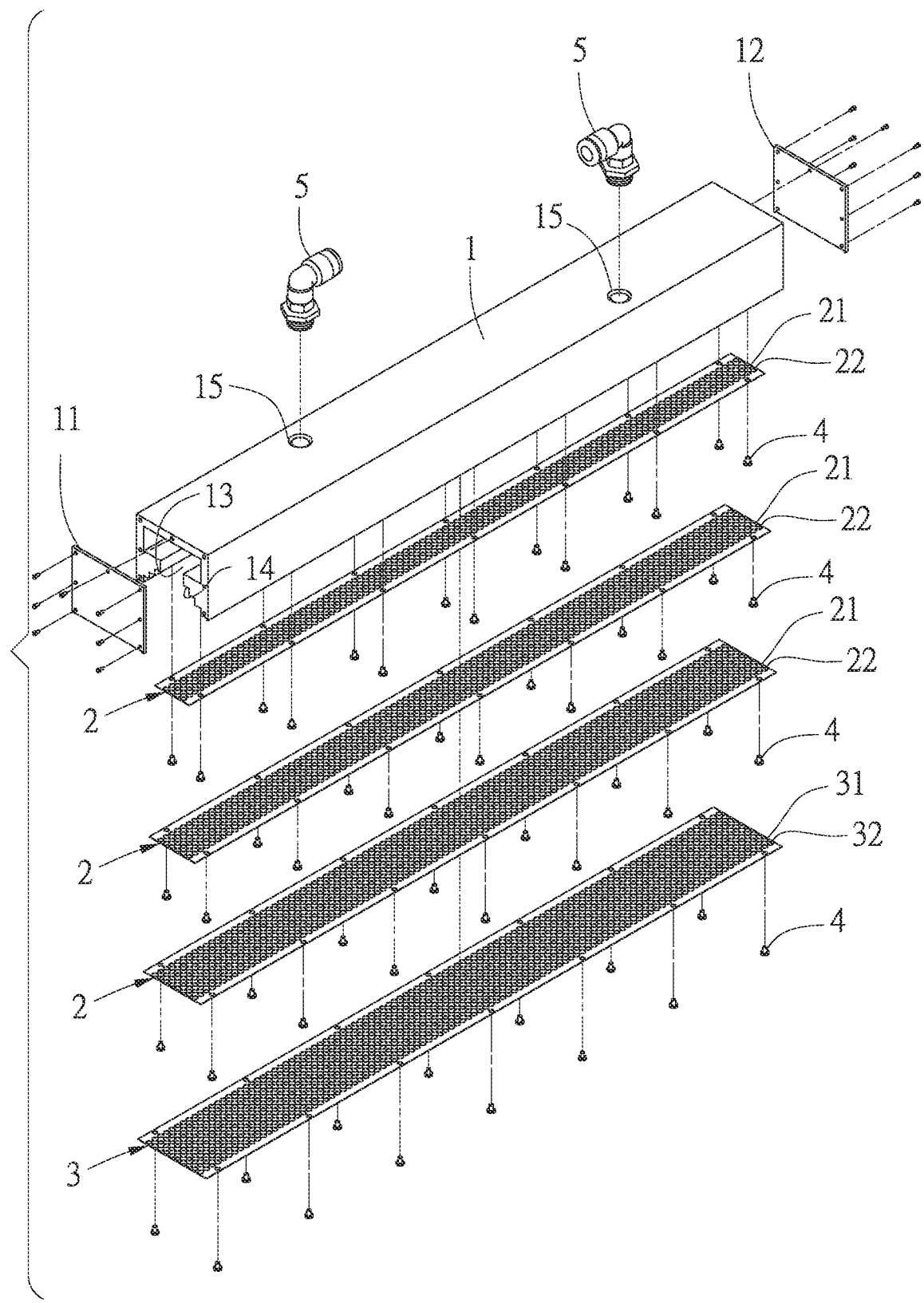
FIG. 2 is an exploded view according to the first embodiment of the present invention.
Figure 3:
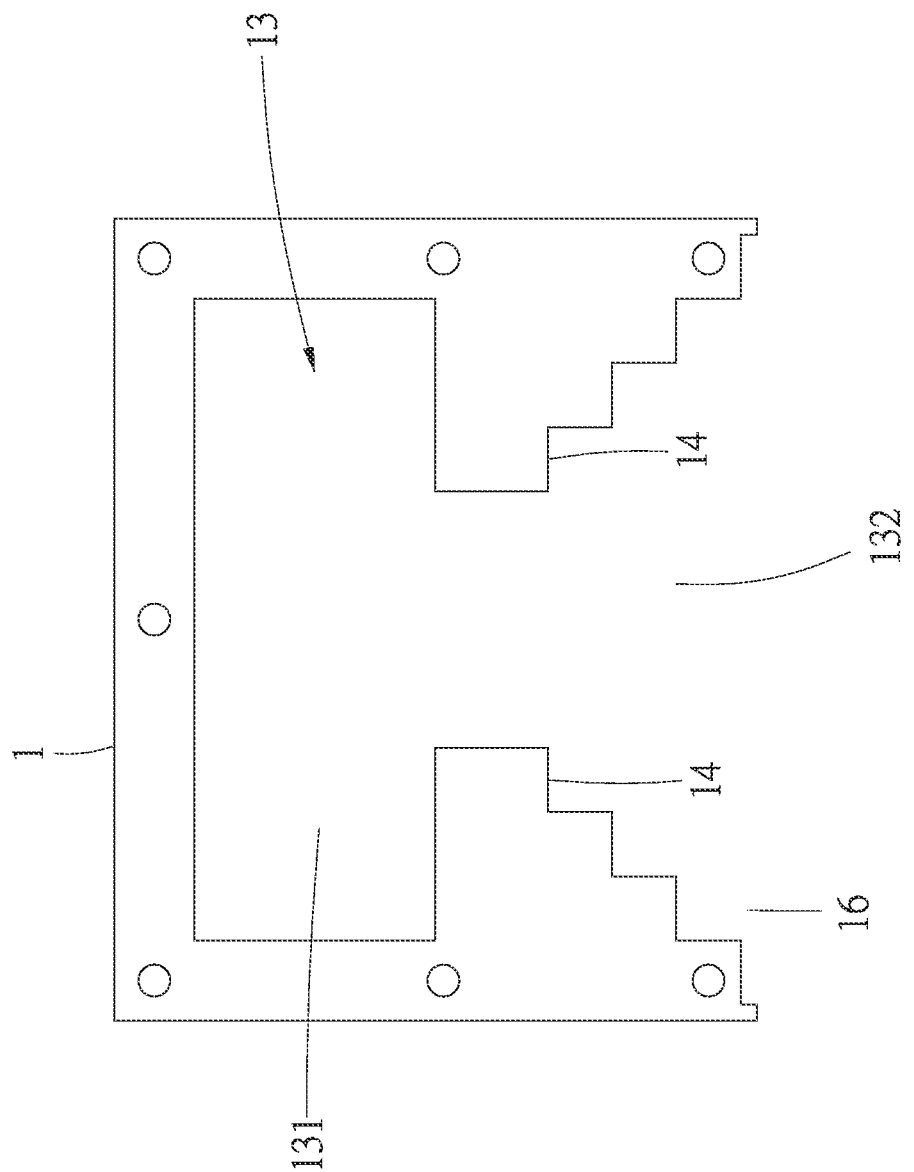
FIG. 3 is a side view according to the first embodiment of the present invention, showing the interior space of the casing without the gas guide plates.

Referring to FIGS. 1 to 6, a gas curtain device for a front opening unified pod according to a first embodiment of the present invention comprises a casing 1, at least one first gas guide plate 2, and a second gas guide plate 3.

The casing 1 extends along a length direction and is integrally formed, in cooperation with a front panel 11 and a rear panel 12. An interior space 13 is defined in the casing 1. The gas curtain device is disposed on the upper side of a load port 8 of the front opening unified pod inside equipment front end modules (EFEM).

Figure 6:
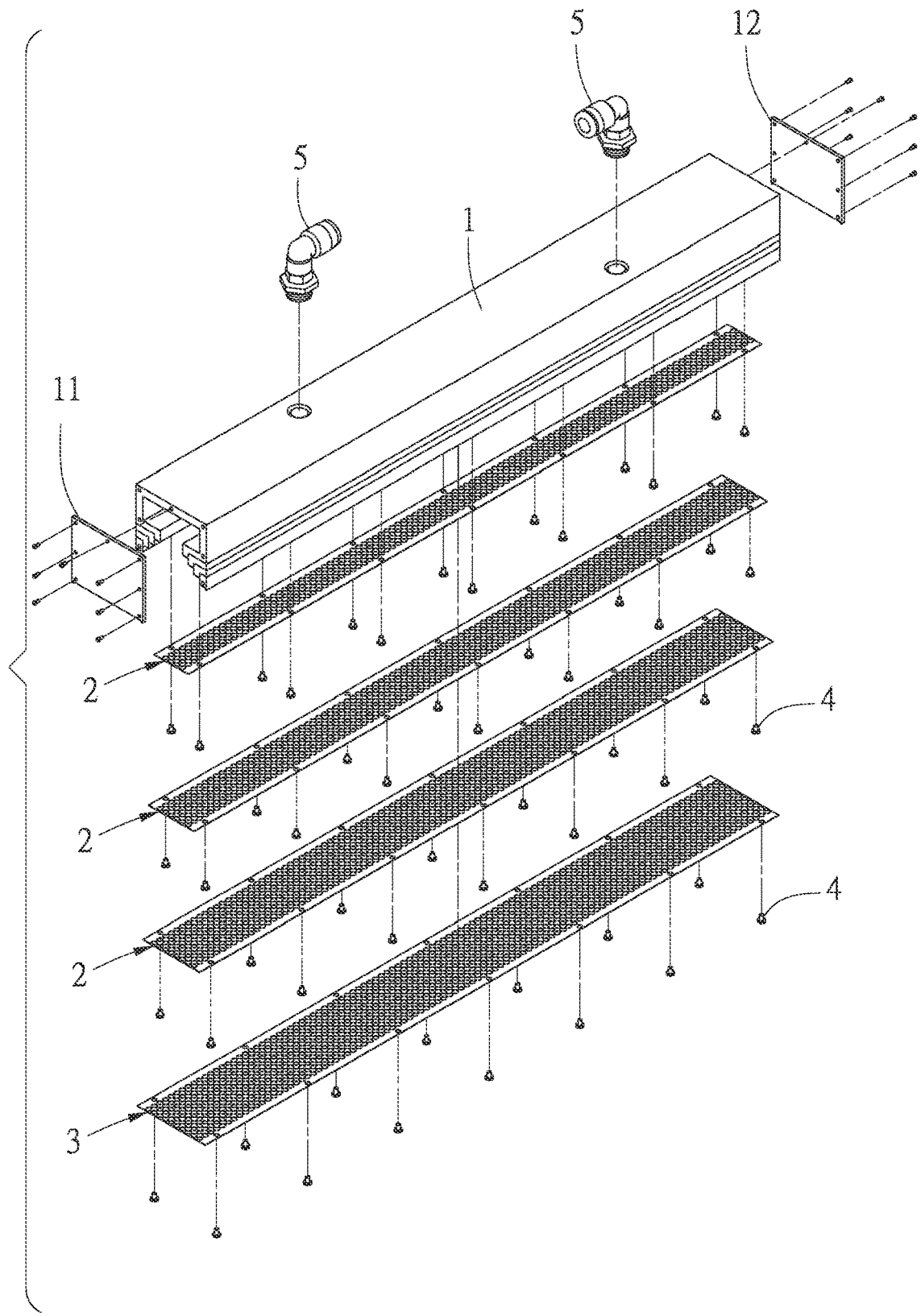
FIG. 6 is an exploded view of the present invention, wherein the casing is formed by detachable superposed block structures.

In the first embodiment, the interior space 13 defines a T-shaped first gas space 131 and a second gas space 132 communicating with the first gas space 131 according to the cross-section of the casing 1. Two side walls inside the second gas space 132 of the casing 1 are expanded outward from top to bottom to form a plurality of symmetrical stepped portions 14 that are arranged in pairs. The top of the casing 1 has two gas inlets 15 communicating with the first gas space 131. The bottom end of the casing 1 has a gas outlet 16 communicating with the second gas space 132. In addition, as shown in FIG. 6, the casing 1 may be formed by a plurality of detachable superposed block structures, but not limited thereto.

The first gas guide plate 2 extends along the length direction and is disposed in the second gas space 132. The first gas guide plate 2 has a first gas guide region 21 extending along the length direction. The first gas guide region 21 has a plurality of longitudinal first gas guide holes 22. In this embodiment, the at least one first gas guide plate 2 includes three first gas guide plates. The three first gas guide plates 2 face each other in the vertical direction. The area of the upper first gas guide region 21 is less than that of the lower first gas guide region 21. In addition, the widths of the three first gas guide plates 2 are equal to the distances between the symmetrical stepped portions 14 in pairs, respectively. The three first gas guide plates 2 are matched with and coupled to the symmetrical stepped portions 14 in pairs, respectively. In this embodiment, the gas curtain device further includes a plurality of fixing parts 4, such as screws. The fixing parts 4 pass through two opposite outer sides of the three first gas guide regions 21 from bottom to top respectively for locking the three first gas guide plates 2 to the symmetrical stepped portions 14.

The second gas guide plate 3 extends along the length direction and is disposed at a distal end of the second gas space 132 adjacent to the gas outlet 16. The second gas guide plate 3 is opposite to the first gas guide plates 2. The second gas guide plate 3 has a second gas guide region 31 facing the first gas guide region 21 in the vertical direction and extending along the length direction. The area of the first gas guide region 21 is less than that of the second gas guiding region 31. The second gas guide region 31 has a plurality of longitudinal second gas guide holes 32. The width of the second gas guide plate 3 is equal to the distance between the lowest pair of the symmetrical stepped portions 14. The second gas guide plate 3 is matched with and coupled to the lowest pair of the symmetrical stepped portions 14. The fixing parts 4 pass through two opposite outer sides of the second gas guide regions 31 from bottom to top for locking the second gas guide plate 3 to the symmetrical stepped portions 14.

Figure 4:
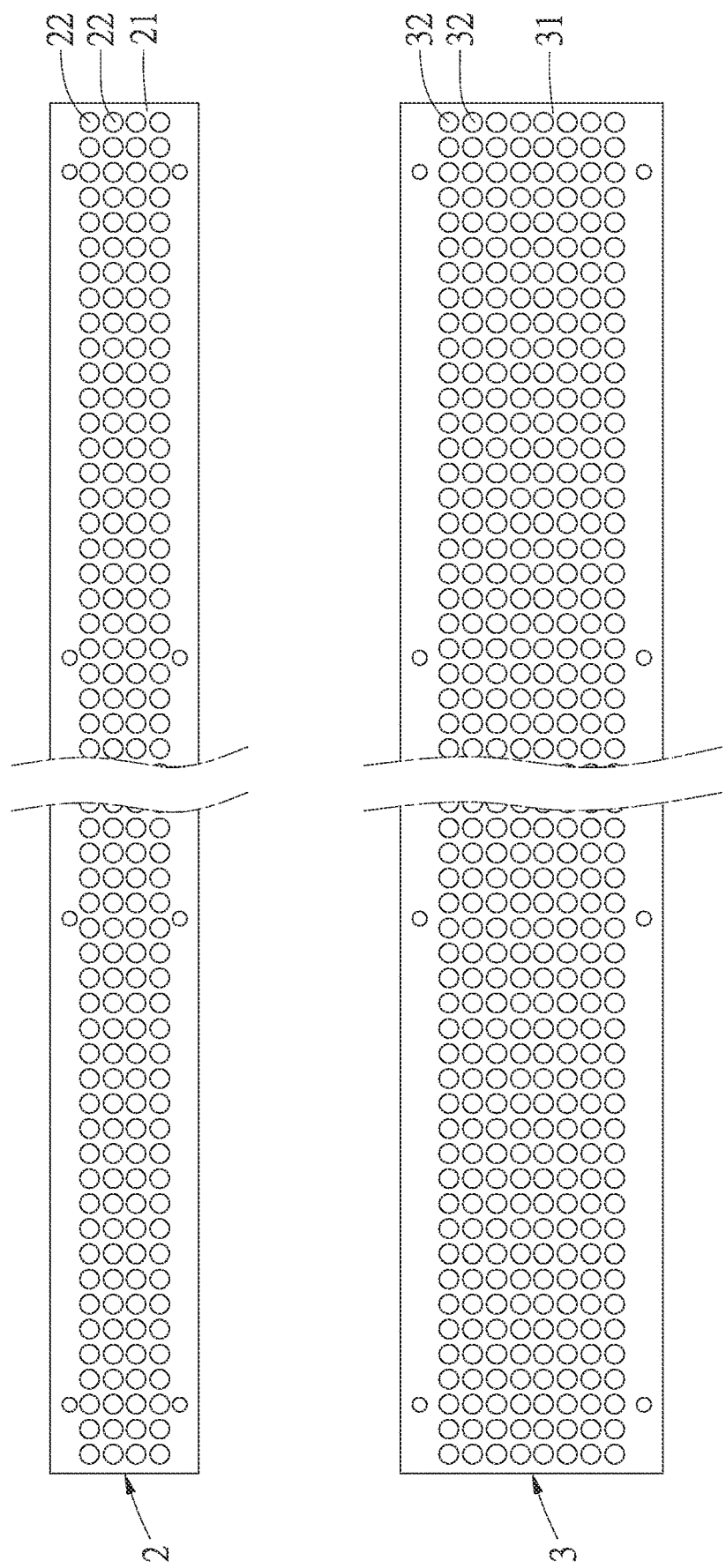
FIG. 4 is a planar schematic view of the first gas guide plate and the second gas guide plate according to the first embodiment of the present invention.

In addition, as shown in FIG. 4, the number of the second gas guide holes 32 provided by the present invention is greater than the number of the first gas guide holes 22, and the total area of the second gas guide holes 32 of the second gas guide plate 3 is greater than the total area of the first gas guide holes 22 of the first gas guide plate 2. A single first gas guide plate 2 is compared with the second gas guide plate 3 to obtain the number and the total area of the first gas guide holes 22 and the number and total area of the second gas guide holes 32. The less the number of gas guide holes and the less the total area of gas guide holes of the gas guide plate, the faster the velocity of the gas flow and the lower the uniformity. Conversely, the greater the number of gas guide holes and the greater the total area of gas guide holes of the gas guide plate, the slower the velocity of the gas flow and the higher the uniformity. Therefore, the velocity of the gas flow passing through the first gas guide plate 2 is fast, and the uniformity of the gas flow passing through the second gas guide plate 3 is high.

In addition, gas pipes 5 are connected to the two gas inlets 15 of the casing 1, respectively. The upper end of the gas pipe 5 is opened for introducing a clean and dry gas, and the lower end of the gas pipe 5 has an outlet 51. The outlet 51 of the gas pipe 5 is inserted into the corresponding gas inlet 15, so that the outlet 51 communicates with the first gas space 131, and the clean and dry gas is introduced into the interior space 13 of the casing 1 through the gas inlet 15 and delivered to the gas outlet 16 through the first gas guide holes 22 and the second gas guide holes 32.

It should be noted that, through the first gas space 131 having a T-shaped cross-section, the gas is first fully mixed in the first gas space 131 instead of being discharged downward directly and rapidly. In this way, when the gas is delivered to the first gas space 131, the velocity of the gas flow can be reduced. The second gas space 132 of the casing 1 has a stepped cross-section, so that the space of the second gas space 132 is gradually enlarged through the stepped portions 14 in pairs because the distances between the symmetrical stepped portions 14 in pairs gradually increase from top to bottom. In this way, when the gas flows through the first gas guide holes 22 of the first gas guide plates 2 to the second gas space 132, the gas sequentially flows through the stepped portions 14 with gradually increasing distances, which enables the gas to be fully mixed in the second gas space 132. In addition, when the gas collides with the side walls of the second gas space 132, the gas is further fully mixed with each other by rebounding. Furthermore, because the number and the total area of the gas guide holes of the lower gas guide plate are greater than the number and the total area of the gas guide holes of the upper gas guide plate, the gas flow can be regulated to have different velocities and uniformities when the gas flow passes through the first gas guide plates 2 and the second gas guide plate 3 in the interior space 13.

Figure 5:
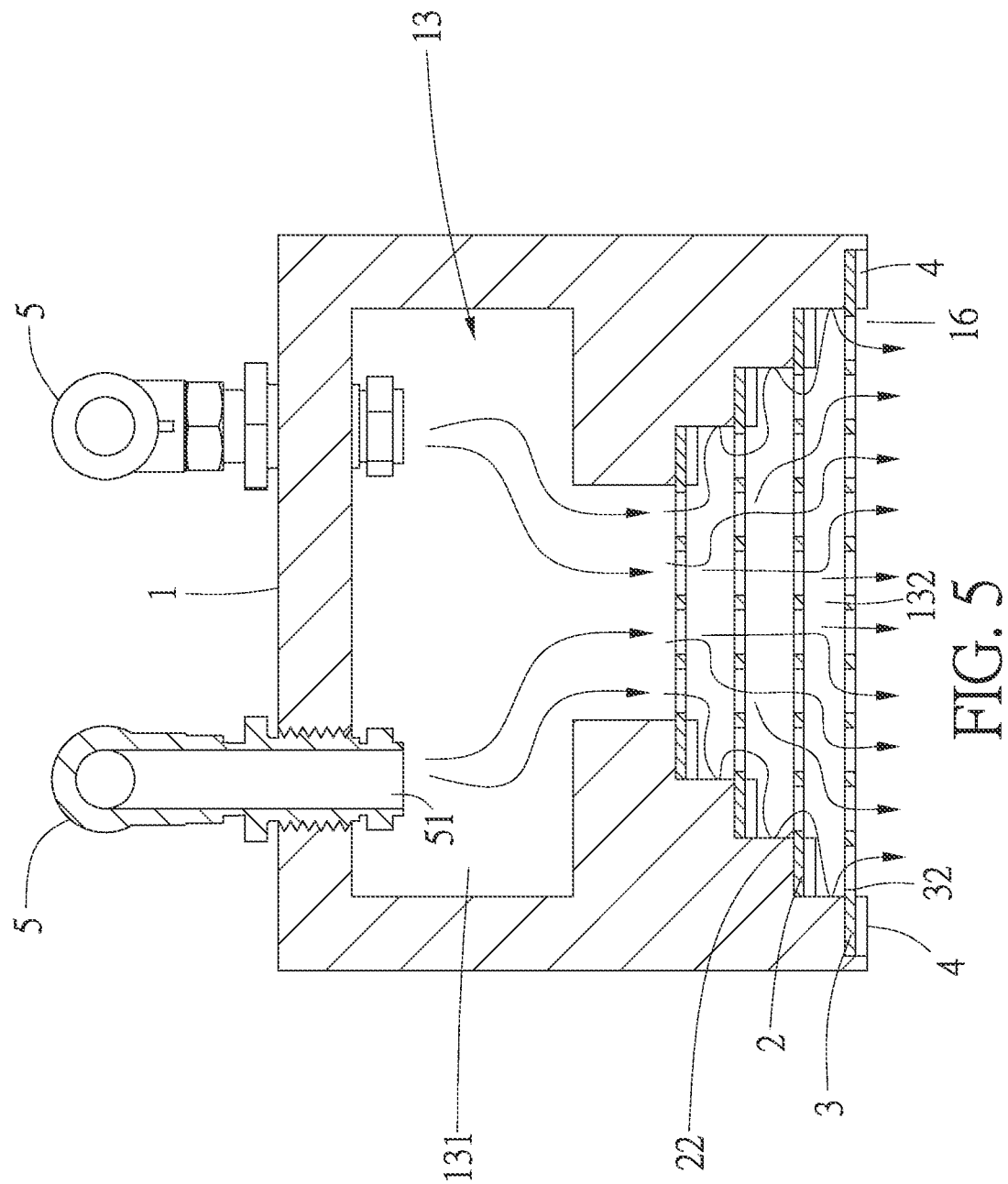
FIG. 5 is a schematic view according to the first embodiment of the present invention when in use.

With the above structure of the present invention, when the gas is introduced into the casing 1 via the gas pipes 5, as shown in FIG. 5, the gas is first introduced into the first gas space 131 from each outlet 51 to form a gas flow. Through the first gas space 131 having a T-shaped cross-section, the gas flow in the first gas space 131 is fully mixed in the first gas space 131 for a period of time and then injected into the second gas space 132 via the circular first gas guide holes 22 of the uppermost first gas guide plate 2 located in the second gas space 132. When the gas flow passes through the circular first gas guide holes 22, the velocity of the gas flow is accelerated because the number of the first gas guide holes 22 is less and the total area of the first gas guide holes 22 of the first gas guide plate is less.

Then, the gas flow continuously flows through the first gas guide holes 22 of the first gas guide plate 2 located between the uppermost first gas guide plate 2 and the second gas guide plate 3. The number and the total area of the first gas guide holes 22 of the lower first gas guide plate 2 are greater than the number and the total area of the first gas guide holes 22 of the upper first gas guide plate 2. That is, the number and the total area of the first gas guide holes 22 of the uppermost first gas guide plate 2 are less than the number and the total area of the first gas guide holes 22 of the middle first gas guide plate 2, and the number and the total area of the first gas guide holes 22 of the middle first gas guide plate 2 are less than the number and the total area of the first gas guide holes 22 of the lowermost first gas guide plate 2. This allows the accelerated gas flow to be slowed down for a period of time to improve uniformity. The gas flow is regulated to flow downward in straight lines.

When the gas flow passes through the second gas guide holes 32 adjacent to the gas outlet 16, because the number and the total area of the second gas guide holes 32 of the second gas guide plate 3 are greater than the number and the total area of the first gas guide holes 22 of each first gas guide plate 2, the uniformity of the gas flow can be improved and the gas flow can be regulated to flow downward uniformly in straight lines, so as to ensure that the gas flow will flow uniformly in straight lines when it is blown out via the gas outlet 16. Finally, the uniform gas flow flowing in straight lines is discharged via the gas outlet 16.

The feature of the present invention is that through the design of the flow channel structure, the gas flow passes through the multiple gas guide plates to create a regulation effect. Besides, because the number and the total area of the gas guide holes of the lower gas guide plate are greater than the number and the total area of the gas guide holes of the upper gas guide plate, the gas flow can be regulated to have different velocities and uniformities when the gas flow passes through the first gas guide plates 2 and the second gas guide plate 3 in the interior space 13. Finally, when the gas flow passes through the second gas guide holes 32, the uniformity of the gas flow can be improved, and the gas flow can be regulated to flow uniformly in straight lines. Thus, it is ensured that the gas flow is discharged from the gas outlet 16 at a proper speed, is distributed uniformly and flows in straight lines. The present invention can reliably block moisture and fine particles and prevent moisture and fine particles from entering the front opening unified pod.

Figure 7:
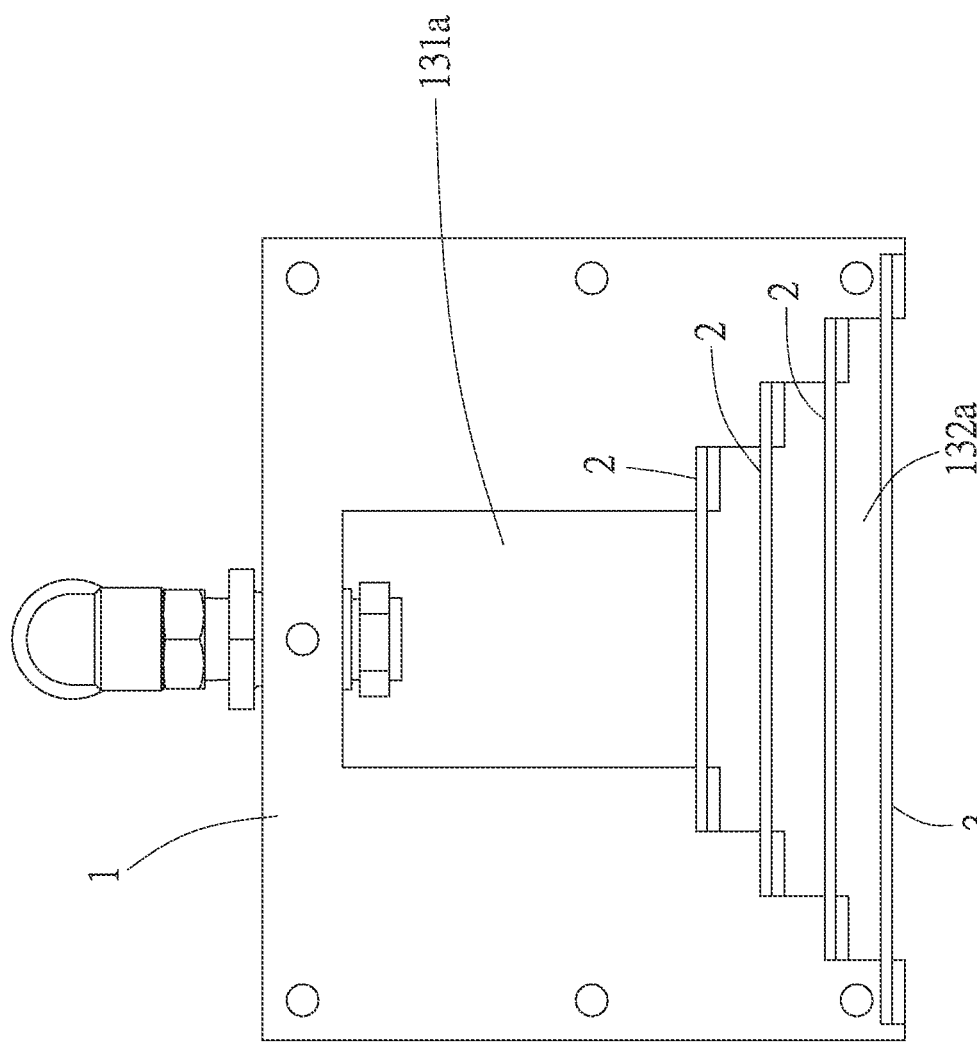
FIG. 7 is a side view according to a second embodiment of the present invention, showing the interior space of the casing.

FIG. 7 illustrates a second embodiment of the gas curtain device for the front opening unified pod provided by the present invention. The second embodiment is substantially similar to the first embodiment with the exceptions described hereinafter. In the second embodiment, the first gas space 131a is upright according to the cross-section of the casing 1. The gas is also well mixed in the first gas space 131a instead of being discharged downward directly and rapidly. In this way, when the gas is delivered to the first gas space 131a, the velocity of the gas flow can be reduced and the gas can mixed to improve the uniformity of the gas flow.

Figure 8:
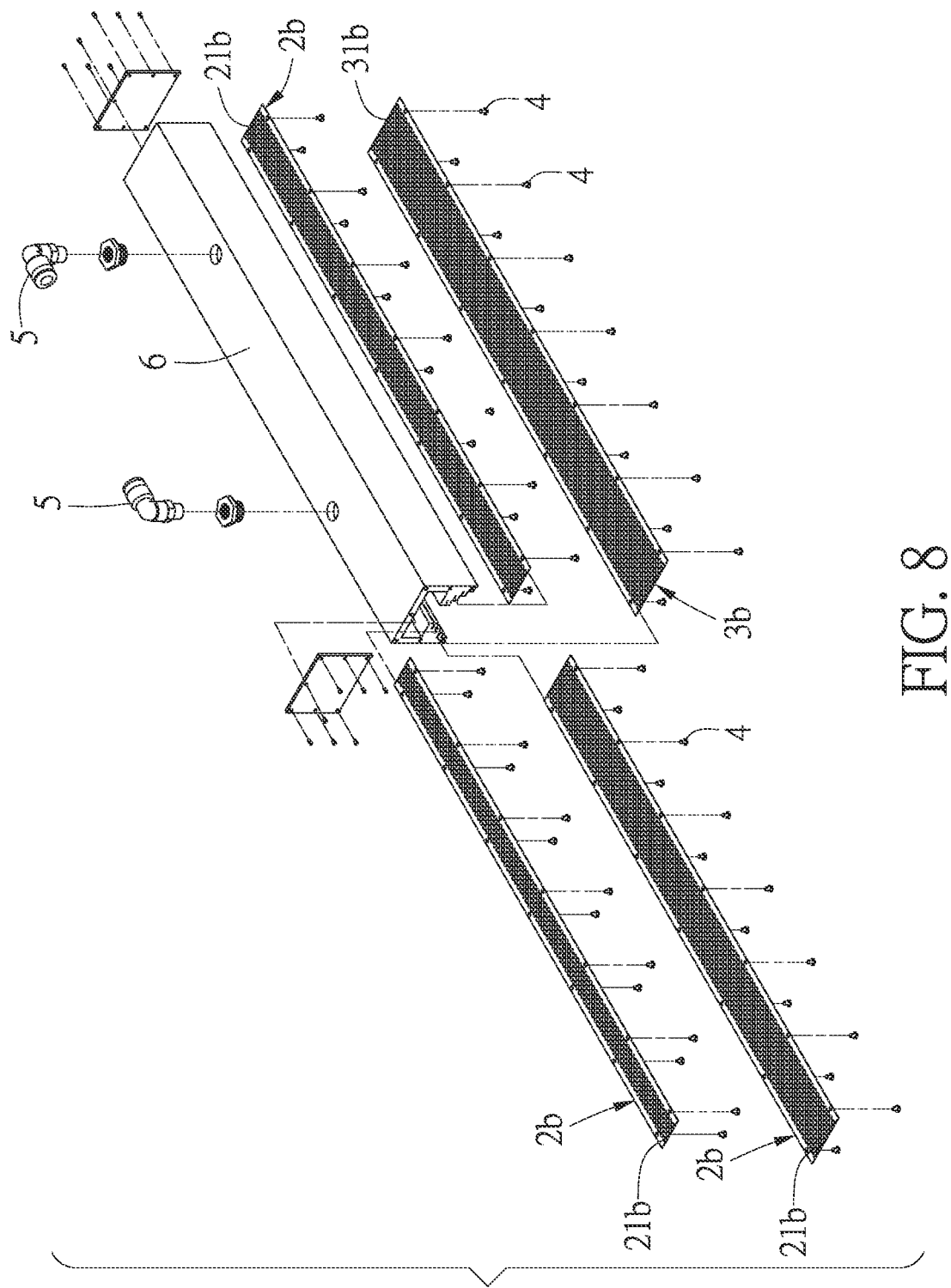
FIG. 8 is an exploded view according to a third embodiment of the present invention.
Figure 9:
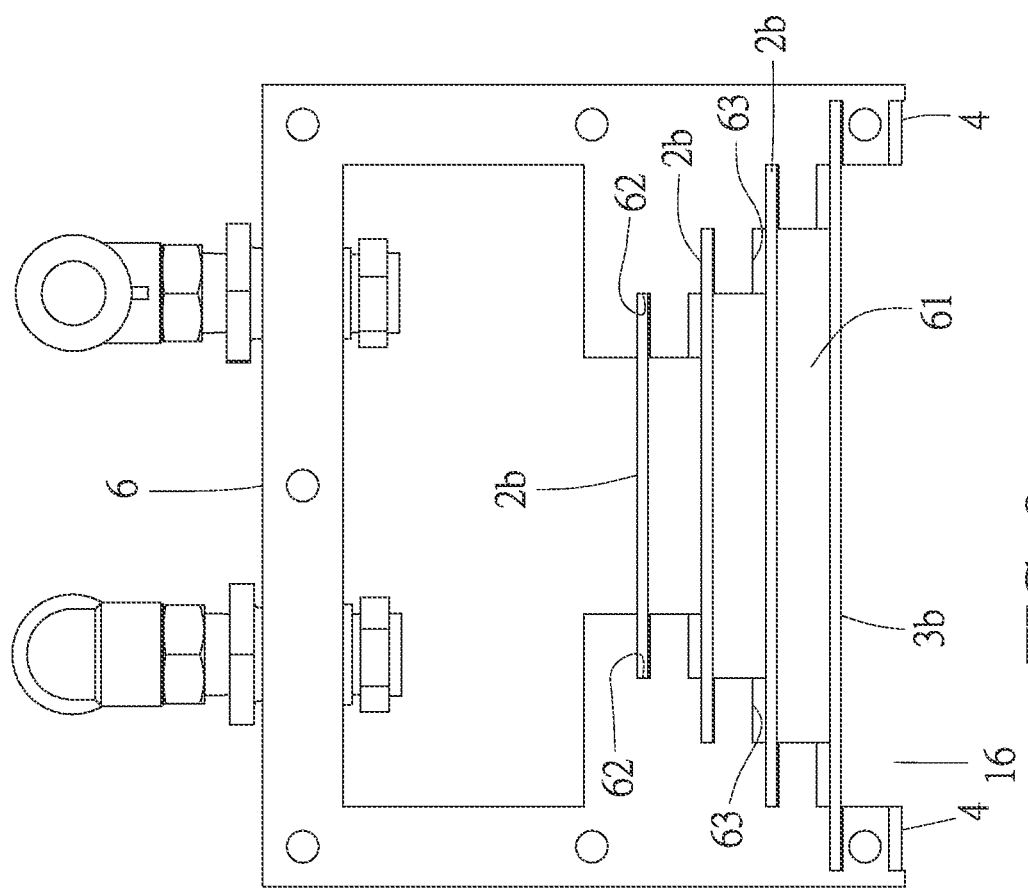
FIG. 9 is a side view according to the third embodiment of the present invention, showing the interior space of the casing.

FIG. 8 and FIG. 9 illustrate a third embodiment of the gas curtain device for the front opening unified pod provided by the present invention. The third embodiment is substantially similar to the first embodiment with the exceptions described hereinafter. In the third embodiment, two side walls inside the second gas space 61 of the casing 6 are formed with grooves 62 for insertion of two opposite sides of the three first gas guide plates 2b and the second gas guide plate 3b. The fixing parts 4 pass through the two opposite outer sides of the three first gas guide regions 21b and the second guide regions 31b for locking the three first gas guide plates 2b and the second gas guide plate 3b to the symmetrical stepped portions 63. The gas flow passes through the multiple gas guide plates to create a regulation effect, so the uniformity of the gas flow can be improved and the gas flow can be regulated to flow uniformly in straight lines. Thus, it is ensured that the gas flow is discharged from the gas outlet 16 at a proper speed, is distributed uniformly and flows in straight lines. The present invention can reliably block moisture and fine particles and prevent moisture and fine particles from entering the front opening unified pod.

Figure 10:
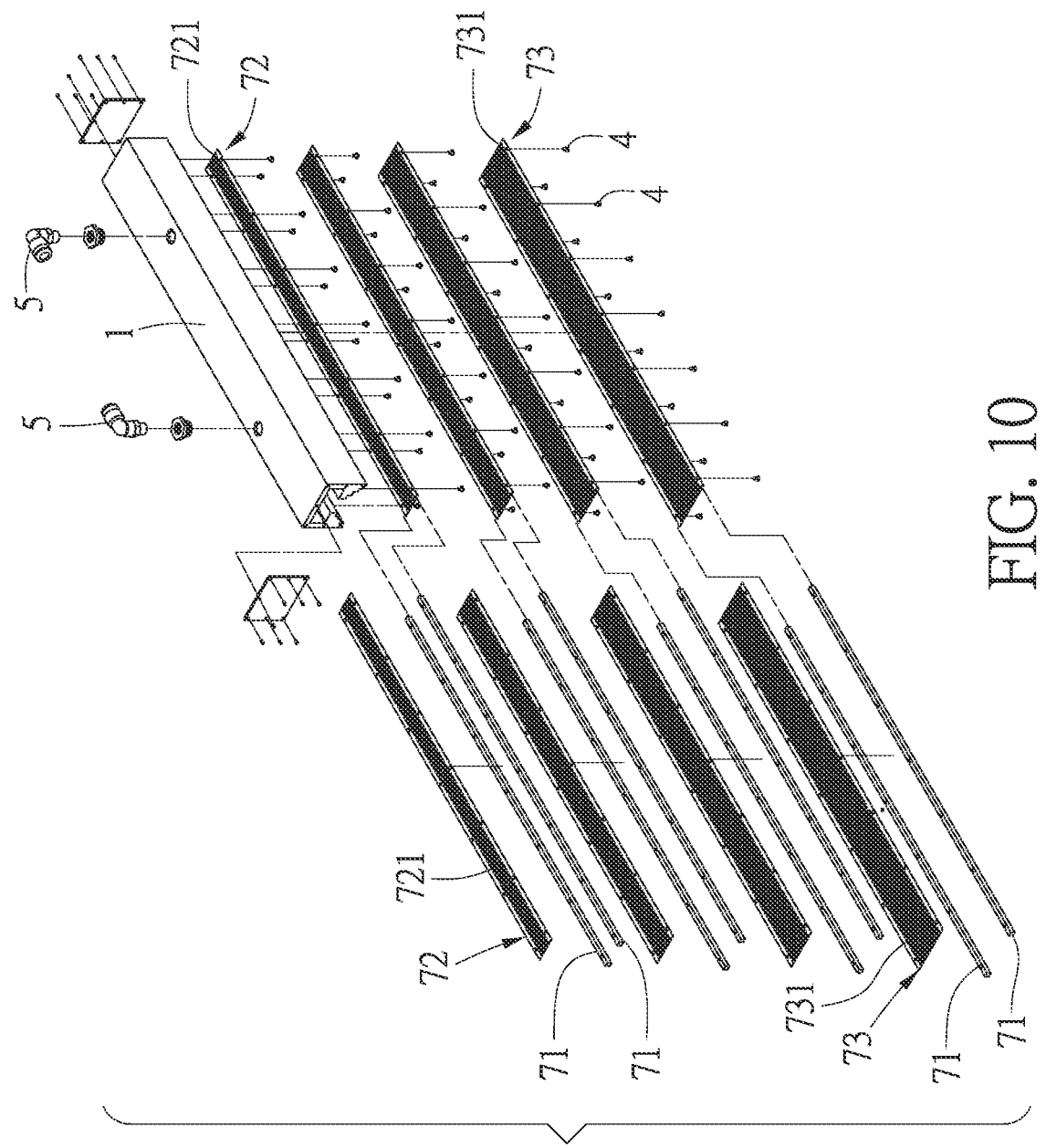
FIG. 10 is an exploded view according to a fourth embodiment of the present invention.
Figure 11:
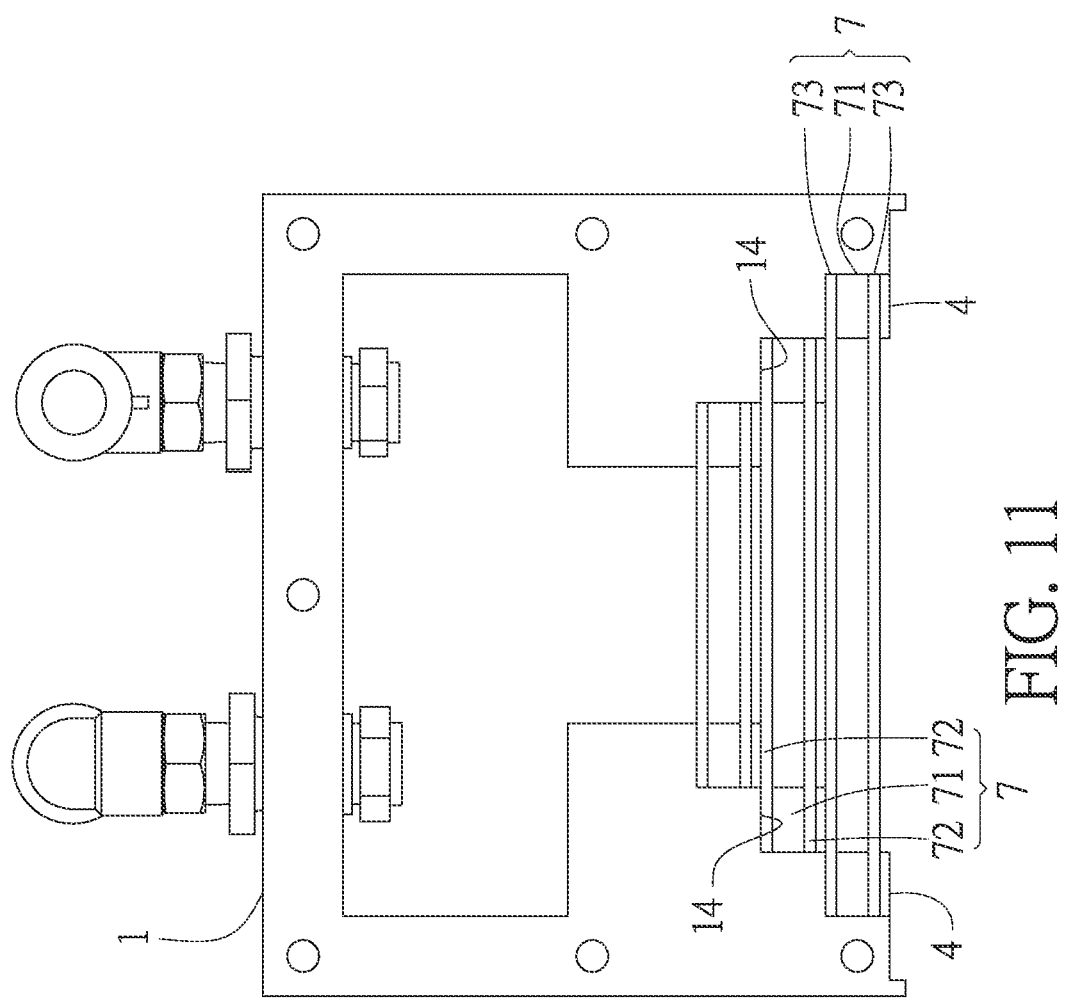
FIG. 11 is a side view according to the fourth embodiment of the present invention, showing the interior space of the casing.

FIG. 10 and FIG. 11 illustrate a fourth embodiment of the gas curtain device for the front opening unified pod provided by the present invention. The fourth embodiment is substantially similar to the first embodiment with the exceptions described hereinafter. In the fourth embodiment, the present invention further comprises a plurality of gas guide assemblies 7. Each gas guide assembly 7 is composed of two spacers 71 and two first gas guide plates 72 or composed of two spacers 71 and two second gas guide plates 73. The two spacers 71 are disposed on two opposite sides of the two first gas guide plates 72 or the two second gas guide plates 73 and located between the corresponding two first gas guide plates 72 or the two second gas guide plates 73. The fixing parts 4 locks the gas guide assemblies 7 to the symmetrical stepped portions 14. The gas flow passes through the multiple gas guide plates to create a regulation effect, which plays the same function as the first embodiment. The present invention can reliably block moisture and fine particles and prevent moisture and fine particles from entering the front opening unified pod.

It should be noted that, the structure of the second embodiment may be assembled with the structure of the first, third or fourth embodiment, but not limited thereto.

What is claimed is:

1. A gas curtain device for a front opening unified pod, comprising:
   a casing configured with an upper wall having two opposite side edges and a pair of external side walls, each external side wall of said pair thereof having an external surface and an internal surface extending between an upper edge and a bottom edge of said each external side wall, wherein said each external side wall extends downward from said upper wall at a respective side edge of said two opposite side edges thereof, and wherein said upper wall and said internal surface of said each external side wall define therebetween an interior space in said casing, the casing having at least one gas inlet communicating with the interior space and a gas outlet communicating with the at least one gas inlet and the interior space;
   at least one first gas guide plate, disposed in the interior space, the first gas guide plate having a first gas guide region, the first gas guide region having a plurality of first gas guide holes;
   a second gas guide plate, disposed at a distal end of the interior space adjacent to the gas outlet, the second gas guide plate having a second gas guide region facing the first gas guide region in a vertical direction, the second gas guide region having a plurality of second gas guide holes;
   wherein an area of the first gas guide region is smaller than an area of the second gas guide region, the number of the second gas guide holes exceeds the number of the first gas guide holes, and a total area of the second gas guide holes of the second gas guide plate is greater than a total area of the first gas guide holes of the first gas guide plate.

2. The gas curtain device as claimed in claim 1, wherein the interior space defines a first gas space and a second gas space communicating with the first gas space, wherein the casing is further configured with two internal side walls defining the second gas space therebetween, wherein each internal side wall of said two internal side walls extends at said internal surface of a respective one of said pair of external side walls in a direction from said first gas space toward said bottom edge of said respective external side wall, said two internal side walls being configured to form a plurality of stepped portions arranged symmetrically in pairs.

3. The gas curtain device as claimed in claim 2, wherein the at least one first gas guide plate includes three first gas guide plates, and a plurality of fixing parts pass through two opposite outer sides of the first gas guide regions of the three first gas guide plates and the second gas guide region of the second gas guide plate for locking the three first gas guide plates and the second gas guide plate to the symmetrical stepped portions.

4. The gas curtain device as claimed in claim 2, wherein the at least one first gas guide plate includes three first gas guide plates, two side walls inside the second gas space of the casing are formed with grooves that are arranged in pairs for insertion of two opposite sides of the three first gas guide plates and the second gas guide plate, and a plurality of fixing parts pass through two opposite outer sides of the first gas guide regions of the three first gas guide plates and the second gas guide region of the second gas guide plate for locking the three first gas guide plates and the second gas guide plate to the symmetrical stepped portions.

5. The gas curtain device as claimed in claim 2, further comprising a plurality of gas guide assemblies, each of the gas guide assemblies being composed of two spacers and two first gas guide plates or composed of two spacers and two second gas guide plates, the two spacers being disposed on two opposite sides of the two first gas guide plates or the two second gas guide plates and located between the corresponding two first gas guide plates or the two second gas guide plates, a plurality of fixing parts being provided for locking the gas guide assemblies to the symmetrical stepped portions.

6. The gas curtain device as claimed in claim 1, wherein the casing is integrally formed.

7. The gas curtain device as claimed in claim 1, wherein the casing is formed by a plurality of detachable superposed block structures.

8. The gas curtain device as claimed in claim 1, wherein a gas pipe is connected to the at least one gas inlet of the casing for introducing a clean and dry gas to flow in the interior space of the casing and flow out from the gas outlet.

9. The gas curtain device as claimed in claim 2, wherein the first gas space has a T-shaped configuration in a vertical cross-section of the casing.

10. The gas curtain device as claimed in claim 2, wherein the first gas space is in contiguous contact with said upper wall of the casing.

* * * * *